United States Patent [19]

Carson et al.

[11] Patent Number: 5,701,233

[45] Date of Patent: Dec. 23, 1997

[54] STACKABLE MODULES AND MULTIMODULAR ASSEMBLIES

[75] Inventors: John C. Carson, Corona del Mar; Robert E. DeCaro, San Juan Capistrano; Ying Hsu, Huntington Beach; Michael K. Miyake, Westminster, all of Calif.

[73] Assignee: Irvine Sensors Corporation, Costa Mesa, Calif.

[21] Appl. No.: 376,799

[22] Filed: Jan. 23, 1995

[51] Int. Cl.⁶ .................. H01L 23/055; H01L 23/053; H05K 7/02; H01R 9/09
[52] U.S. Cl. .................. 361/735; 257/685; 257/686; 257/777; 257/723; 361/744; 361/761; 361/764; 361/733; 361/803; 361/790; 439/66; 439/91
[58] Field of Search .................. 257/685, 686, 257/733, 803, 777, 723, 726, 727; 361/735, 784, 744, 761, 789, 790, 762–764, 792–795, 767–771; 437/209, 915; 439/66, 68, 91

[56] References Cited

U.S. PATENT DOCUMENTS

| | | | |
|---|---|---|---|
| 4,574,331 | 3/1986 | Smolley | 361/735 |
| 4,581,675 | 4/1986 | Smolley | 361/735 |
| 4,764,846 | 8/1988 | Go | 257/686 |
| 5,007,841 | 4/1991 | Smolley | 439/66 |
| 5,027,191 | 6/1991 | Bourdelaise et al. | 257/723 |
| 5,043,794 | 8/1991 | Tai et al. | 357/686 |
| 5,241,456 | 8/1993 | Marcinkiewicz et al. | 257/685 |
| 5,376,825 | 12/1994 | Tukamoto et al. | 257/685 |
| 5,432,681 | 7/1995 | Linderman | 361/790 |

FOREIGN PATENT DOCUMENTS

| | | | |
|---|---|---|---|
| 60-194548 | 10/1985 | Japan | 257/686 |
| 4-30561 | 2/1992 | Japan | 257/723 |
| 5-29534 | 2/1993 | Japan | 257/723 |
| 5-55450 | 3/1993 | Japan | 257/686 |

OTHER PUBLICATIONS

IBM Technical Disclosure Bulletin "Stacked High–Density Multichip Module" by Jarvela et al. vol. 14 No. 10, Mar. 1972.

Palmer & Newton, 3–D Packaging using Low–Temperature Cofired Ceramic The International Journal of Microcircuits & Electronic Packaging vol. 16, No. 4, Fourth Quarter 1993, pp. 279–284.

*Primary Examiner*—Donald Sparks
*Attorney, Agent, or Firm*—Plante & Strauss

[57] ABSTRACT

Stacked, multimodular circuit assemblies are provided which comprise stacked, resealable, modules containing electronic circuitry, each module having a plurality of electrically conductive, embedded through-vias between the upper and major surfaces thereof. The through-vias are contained within the module matrix outside of the circuit-containing cavity or "tub" of the module and within the outer edges of the module body. Electronic circuitry contained in the module cavity is electrically connected to the through-vias by signal traces or vias passing out of the cavity and into contact with the through-vias, and adjacent modules are electrically interconnected by a resealable, multichannel connector array between adjacent modules having electrically conductive channels coupling opposing through-vias of the adjacent modules. The connector arrays can also serve to seal the assembly when the entire assemblage of modules is compressed and to connect the stacked modular assembly to exterior circuitry such as a printed circuit board or other device. Methods are also provided for assembling and electrically interconnecting electronic components within such stacked multimodular assemblies by attaching components of an electronic circuit to at least two stackable modules of the type described within the cavity thereof, interconnecting the circuit components with the described through-vias, and stacking and interconnecting the stackable modules with the described multichannel connector arrays interposed between each adjacent module pair.

24 Claims, 9 Drawing Sheets

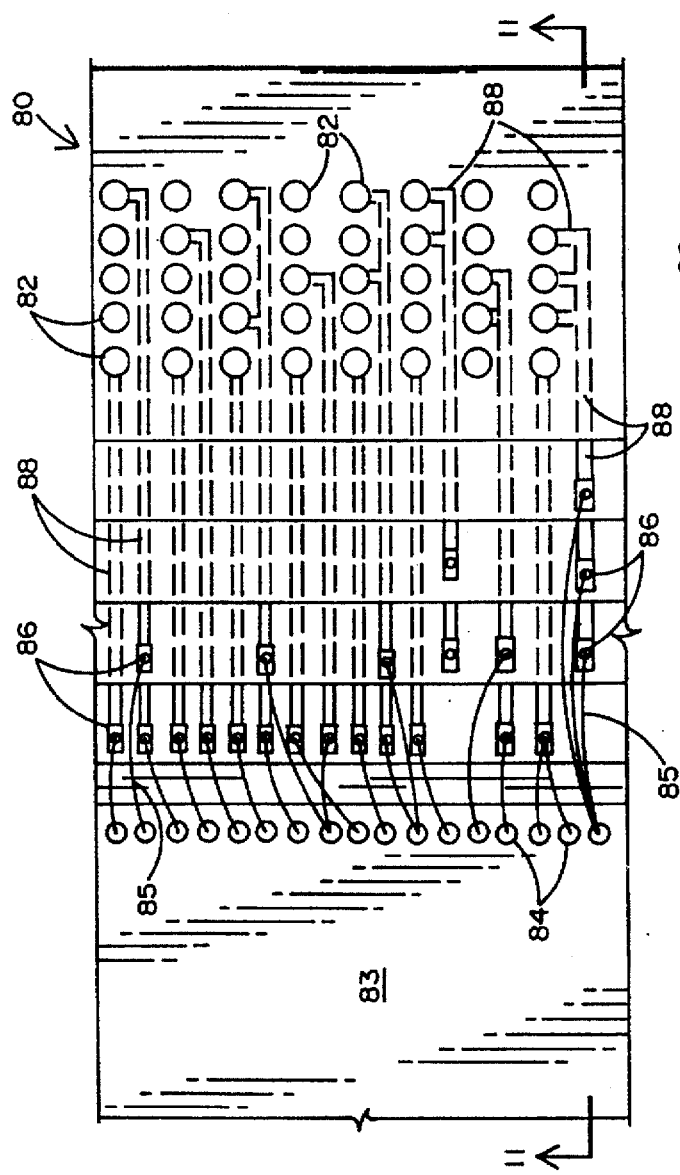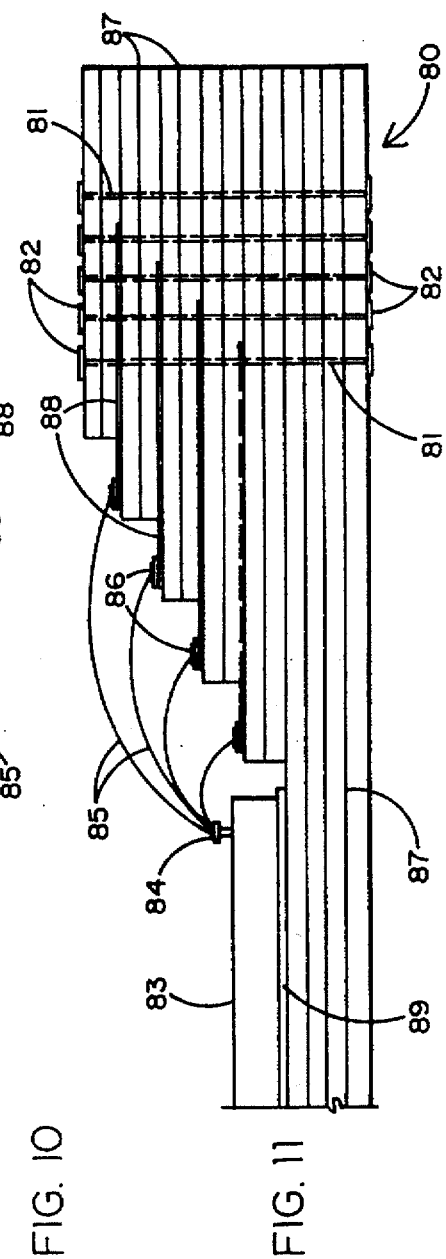
FIG. 10
FIG. 11

STACKABLE MODULES AND MULTIMODULAR ASSEMBLIES

This invention was made with Government support under Contract F29601-93-C-0157 awarded by the Department of Air Force. The Government has certain rights in the invention.

BACKGROUND

1. Field of the Invention

This invention relates to the field of electronics packaging and, in particular, to modules for housing electronic components and interconnecting multiple electronic components in multimodular stacked assemblies and to stacked, multimodular assemblies containing interconnected electronic components.

2. Description of Related Art

The need for greater capacity, more complex, yet coherent and rapid data processing has always exceeded the ability of available technology to meet that need. Nevertheless, advances are constantly being made through the design of faster and more complex processors and essential complementary memories, field programmable gate arrays (FPGAs), application specific integrated circuits (ASICs), and the like. More complex circuits take advantage of multiple parallel processors and ancillary circuitry.

Having the available processors, memories, and other essential components, it is not difficult to conceive of integrated systems capable of performing most desired functions. However, ever increasing processor operating speeds and concomitant limitations on signal travel distance, circuit density limitations imposed by thermal requirements, and other factors quickly introduce realities which eliminate many conceivable circuits from consideration. This is true even when cost is no object and is even more the case when market realities limit acceptable costs of circuit manufacture, testing, reworking, etc. Accordingly, a considerable amount of effort is devoted to circuit designs and layouts which make feasible integrated, heterogeneous circuits that are otherwise only conceivable.

Often the most compelling imperative in circuit design and structure is to limit signal travel distance (duration) between processors, memories, and other ancillary components so that processor operating speed (frequency) need not be limited and reliable data processing and management can be achieved. And often circuit performance is most restricted by the system's ability to accommodate microprocessor frequency which eliminates many circuit design options due to excessive signal travel distance. In fact, processor operating speeds are often reduced or stepped down in view of unavoidable signal travel distance requirements imposed by the system design. For instance, some of the previously known circuit designs discussed hereinafter involve the use of multiple high speed processors and numerous essential memory ICs. Often, any arrangement of such circuit components in two dimensions is impossible due to the signal travel distances required between the processor and other components.

The principal reason for these limitations is known as signal reflection/distortion. Typical digital signals are step functions having extremely fast rise and fall times, and signal duration and rise and fall times decrease markedly as operating frequencies increase. If signal travel distance is relatively long with respect to signal periodic rise and fall time, the signals are reflected in-line and can be distorted by such reflectance to the point that extra or "ghost" signal pulses appear. Obviously, such signal distortion results in system failure, and these problems are exacerbated as microprocessor operating frequencies increase.

Signal reflectance/distortion can be reduced with adequate impedance in the output circuit to "terminate" the signal. This impedance, referred to as "termination impedance," is typically on the order of about 22 to about 33 ohms. It can be readily seen that, while introduction of such impedance might solve the problem of signal distortion, it is unacceptable in many circumstances. The power required to drive the output signals against such impedance is often excessively high, unduly increasing circuit heat load and multiplying several fold the capacity of chip output transistors.

Signal distortion associated with line reflectance, capacitance, inductance, etc., can also be reduced by reducing signal travel distance and/or frequency. Several circuit structures have been used for reducing signal travel distance, e.g., multichip modules (MCMs) and IC chip stacks with one or more access planes (both discussed hereinafter), and signal frequency is often attenuated before exiting higher frequency microprocessors which are internally "clock doubled." Currently, high speed processors may operate at 120 to 130 megahertz with exit signals stepped down to 66 MHz or less, primarily to avoid signal reflection/distortion and thus limiting system speed.

Reducing signal distance poses yet other problems. Conventional multichip modules and PC boards are laid out in two dimensions, and these designs are adequate for simpler circuits but become inadequate for more complex multicomponent systems. FIG. 1 is an illustration of one such two-dimensional microprocessor/memory array available from Intel, Inc., Portland, Oreg., known as iWARP. The array contains three packaged microprocessors 20 mounted on PC board 22 which also carries multiple memory units 24. Memory units 24 are interconnected with the microprocessors by conductors on PC board 22. The area occupied bay this two-dimensional array is about five times the area of the microprocessor chips, and it can be seen that the signal distance to and from the furthermost memory units becomes significant, especially as microprocessor operating frequencies increase.

A similar, contemporary microprocessor/memory array known as n25 available from nCUBE, Beaverton, Oreg., is illustrated in FIG. 2. In this array, the microprocessor package 26 containing microprocessor chip 28 is mounted on PC board 30 which also carries a plurality of memory units 32. As in the iWARP array, the memory units and microprocessor are connected by conductors on PC board 30 and provide memory function required by the microprocessor. As illustrated, the area occupied by the nCUBE array, i.e., the array "footprint," is three to four times the area of the microprocessor chip resulting in significant signal travel distances between microprocessor and memory units.

A unique, hybrid combination of two and three dimensional IC chip arrays designed to reduce component spacing is illustrated in PCT International Publication No. WO 94/13121, Jun. 9, 1994, application No. PCT/US 93/11601, by John C. Carson. The hybrid combination is illustrated, in part, in FIGS. 3 and 4 and combines the memory chips serving each microprocessor within the microprocessor "footprint" by the chip and interconnect arrangement illustrated.

This design represents a significant improvement in microprocessor/memory array component density over the iWARP and nCUBE systems. In Carson, the necessary memory chips are first integrated into a compressed stack having an access plane on one side bonded at "T-connects" or by other connections to the microprocessor, so that the memory stack fits within the microprocessor "footprint." In an alternative embodiment, the memory chip stack is bonded to an interface layer which, in turn, is bonded to and within the "footprint" of the microprocessor. The microprocessor/ memory stacks can further be arranged in a two-dimensional array for massive parallel processing as discussed by Carson. As a consequence of this arrangement, Carson reduces microprocessor-memory spacing and, therefore, the signal travel distance and time.

These and other advantages of three-dimensional chip stacking, wherein chips are bonded directly to each other, and methods of manufacturing such assemblies, are further elaborated, for instance, by Clark, U.S. Pat. No. 4,403,238, Carson, et al, U.S. Pat. Nos. 4,525,921, 4,551,629 and 4,646,128, and Belanger, et al, U.S. Pat. No. 4,617,160. Such chip stacks provide very high circuit densities with conventional IC chips. However, the techniques employed to achieve those results impose some limitations on the flexibility of those assemblies in other respects. For instance, such chip assemblies cannot be easily repaired, and cannot be repaired practically in the field. Furthermore, the geometry of such three-dimensional chip assemblies often places some significant limitations on the diversity of chips that can be incorporated in one unit. IC's come in a variety of sizes with the exterior dimensions depending, primarily, on circuit complexity and layout and the manufacturer's desire to reduce substrate size and cost. For this reason it would be complicated, at best, to incorporate all of the ICs required for a heterogeneous circuit into a single cube. Another problem with densely packed cube structures, such as those described by Carson and others, supra, are limitations on heat transfer which may not be acceptable under some circumstances. Obviously, the circuit density of the densely packed cube devices concentrates thermal load and must be accommodated by adequate cooling.

Yet another alternative for using the third dimension to reduce overall circuit area is described by Palmer and Newton in their article "3-D Packaging Using Low-Temperature Cofired Ceramic (LTCC)," Int'l. Journal of Microcircuits and Electronic Packaging, V. 16, No. 4, 4th Quarter, 1993, pp. 279–83. These authors describe a multimodular/stacked memory device in which a plurality of chip carriers, or tubs, each containing one or two memory ICs, are stacked and interconnected with external electrical interconnects, e.g. solder or conductive epoxy. Signals to and from the internal memory units are communicated to the module's exterior edge, in part, by interior metallization between layers of cofired ceramic. The external and internal circuitry is connected, in part, through a series of what the authors call "blind castellations" within the matrix of each module. Those blind constellations are vertical vias within the module matrix electrically connected to the interior and exterior of the module body by interlaminar metallization.

SUMMARY

We have found that the two- and three-dimensional IC circuit layouts known in the art suffer one or more disadvantages which limit system performance with complex, multi-component, high speed circuits presently available. The necessity of reducing signal travel distance and time between circuit components has been discussed somewhat above, and further limitations are placed on currently available circuit layouts, particularly in some situations, by space requirements, ease of component testing, in-field testing and repairability, and heat load, particularly in dense, three-dimensional integrated packages.

These and other deficiencies of prior art devices can be ameliorated with the stackable modules and multimodular assemblies of this invention. These multimodular assemblies comprise stacked, resealable, electronic circuit modules having a plurality of electrically conductive embedded through-vias between the upper and lower major surfaces of each module. Those through-vias are embedded within the module matrix outside of the circuit-containing cavity or tub of the module and within the outer edges of the module body.

The stacked modules are electrically interconnected by interposing between adjacent modules a resealable, multichannel connector array having electrically conductive channels coupling opposing through-vias in the adjacent modules. The connector arrays also serve to seal the assembly when the entire assemblage is compressed together by retaining pins or other device.

These assemblies provide several advantages over presently available circuit designs. They enable the reliable construction of high-density, complex, high speed circuits with all ancillary supporting circuitry without limiting chip selection, ease of component testing, hermeticity, or in-field repairability.

While the reduced "footprint" of these assemblies and their reduced overall volume result in higher power densities and, therefore, higher specific heat loads, the interconnecting through-vias provide heat transfer throughout the assembly adequate to dissipate the increased heat load even with complex circuits, and they thus make possible assemblies which would not otherwise be feasible due to thermal load.

The assembled systems comprise a plurality of heterogeneous (multicomponent) hermetic, separately testable modules which can be independently tested and replaced on site thereby preventing costly down time and factory reworking. The through-via design affords the option of providing vias in excess of the number required for the original circuit design to allow for heat dissipation and circuit redesign and expansion; i.e. additional modules. It also reduces internal wiring density due to its flexible Z-axis configuration. This simplicity, in turn, reduces substrate wiring complexity and enables the use of simpler, high-yield laminated module designs by reducing the number of signal trace layers (between module lamina) required due to the staggered and multiple row placement of vertical vias around the periphery of the component cavities.

BRIEF DESCRIPTION OF THE DRAWINGS

These and other advantages, variations and modifications of this invention will be apparent from the following description and drawings, of which:

FIG. 10 is a top partial view of a hypothetical module in accordance with this invention illustrating circuit to module wire bonding, interlaminar signal trace layout, and trace-to-through-via orientation;

FIG. 11 is a side sectional view of the hypothetical assembly illustrated in FIG. 10;

DETAILED DESCRIPTION

Figure 1:
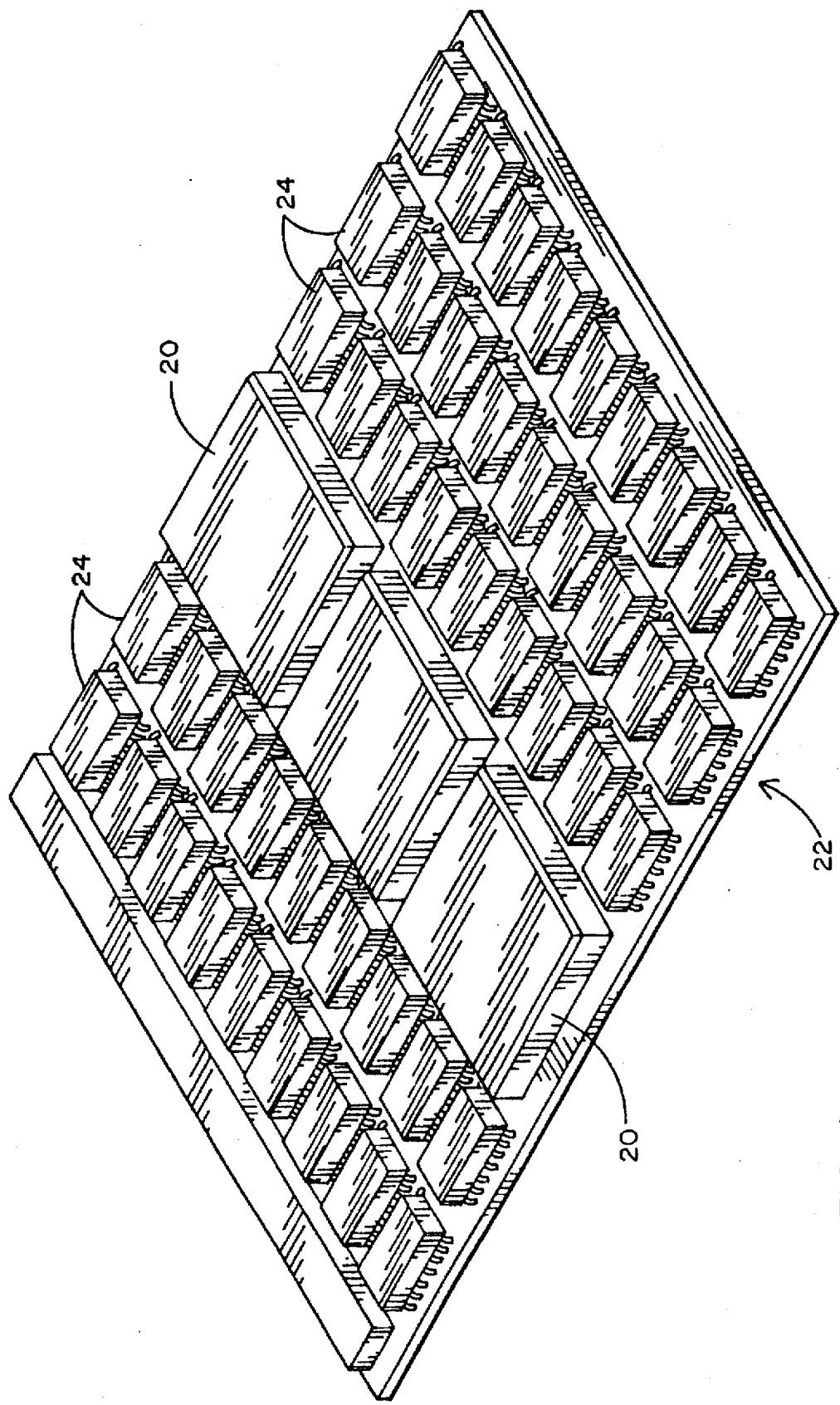
FIG. 1 is an isometric view of the commercially available two-dimensional, board mounted iWARP microprocessor system with support memory.
Figure 2:
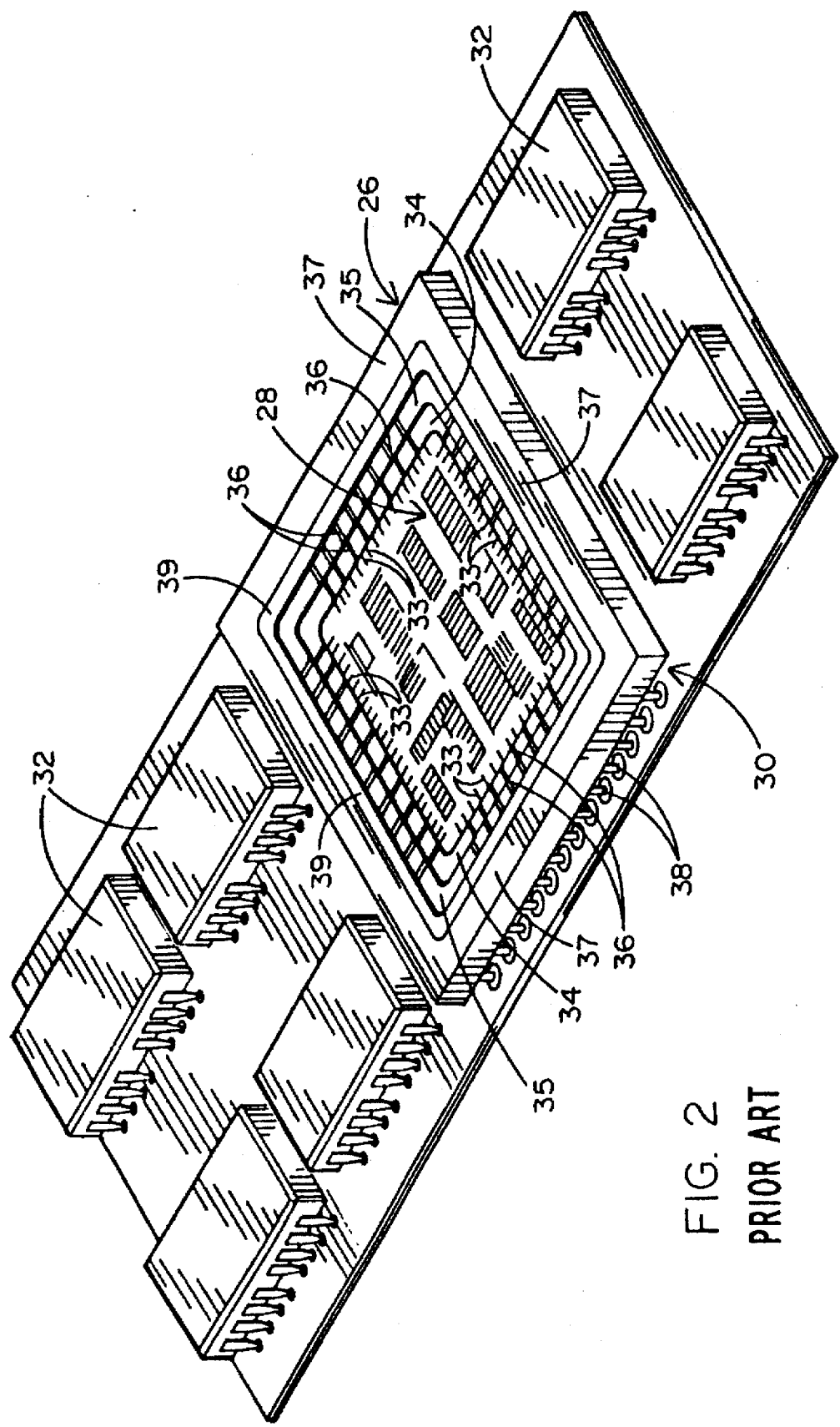
FIG. 2 is an isometric view of a commercially available nCUBE microprocessor system mounted in two dimensions on a single PC board.
Figure 3:
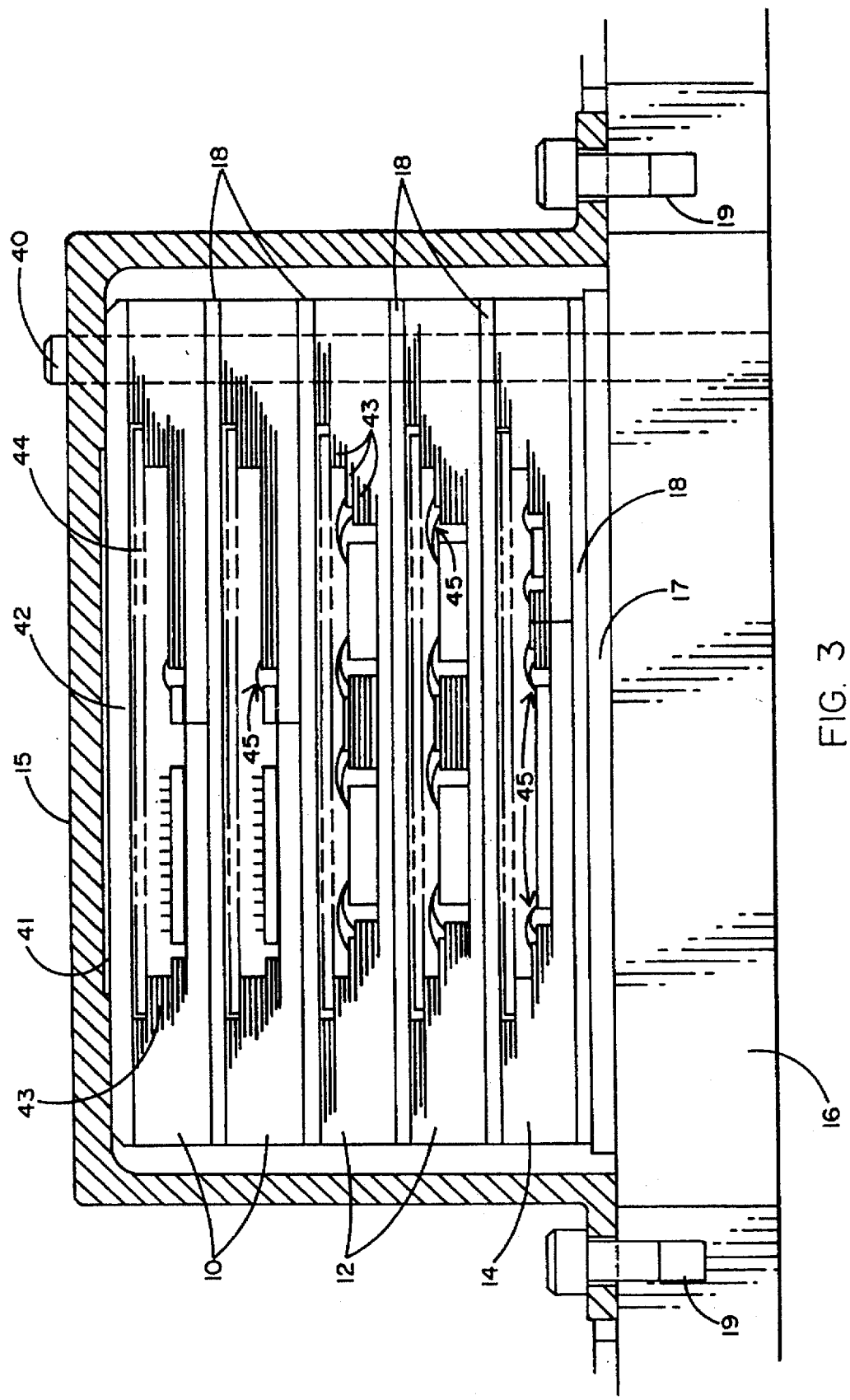
FIG. 3 is a side sectional view of a five-module, multimodular assembly in accordance with this invention containing processor, memory, and programmable ROM circuit modules.

Referring now to the remaining drawings, FIG. 3 is a side-sectional view of a multimodular device in accordance with this invention schematically illustrating five stacked modules 10, 12, and 14 including two electrically erasable, programmable, ROM (EEPROM) modules, 10 and 11, 2 SRAM modules, 12 and 13, and processor module 14. The details of individual modules are illustrated and discussed in more detail with regard to FIG. 4-9 and are illustrated in FIG. 3 only to show the manner in which the modules can be assembled into a unitary structure.

The five modules illustrated in FIG. 3 are electrically interconnected via resealable, multichannel connectors 18, and a similar connector 18 connects the through-vias in lowermost module 14 to circuit board 17 from which signals are distributed beyond housing 15 via circuitry not shown.

The five modules are aligned relative to each other and to circuit board 17 by any suitable positioning device, such as guide pin 40, and the entire assembly is supported on base 16 within housing 15 retained on the base by suitable tie-downs, such as bolts 19. The assembly is rendered more shock-resistant by spacer 42 which can comprise any resilient, preferably dielectric material. Headspace 41 is provided to accommodate compressed entrapped gas during assembly. Also illustrated schematically in FIG. 3 are the various module components (discussed in more detail hereinafter), the multiple layers of refractory 43 from which the modules are assembled in one preferred embodiment, hermetic sealing lids 44 on each module, and wire bonds 45 electrically connecting the components with conductive signal traces on the module lamina. As discussed in more detail hereinafter, the module signal traces just mentioned and not illustrated in FIG. 3 are described in more detail with reference to FIG. 4–11, along with the interconnections between those traces and the embedded through-vias.

Figure 4:
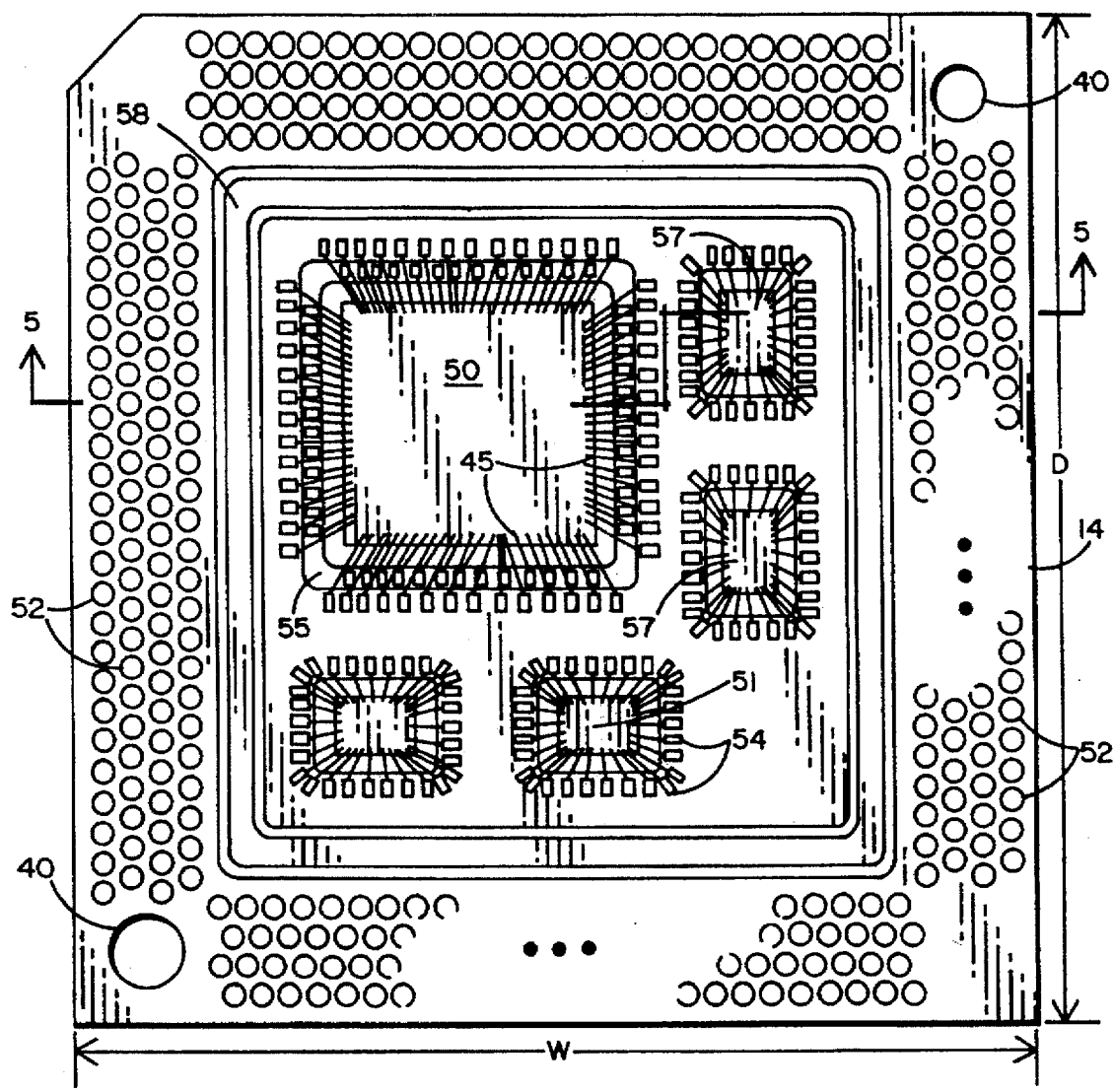
FIG. 4 is a top planar view of the processor module of FIG. 3 showing the processor and address and data buffer chips, wire bonding and other module features.

FIG. 4 is a top planer view of a suitable processor module 14 with processor chip 50 and address and data buffer chips 51 fixedly mounted to the base 55, all of which are electrically interconnected to metal traces on module laminae (not illustrated) via wire bonds 45 and outer bond pads 54. Outer bond pads 54 are electrically connected to through-vias 53 (see FIG. 5) which have contact pads 52 at either end thereof at the upper and lower surfaces of module 14. The processor module 14 illustrated in FIGS. 4 and 5 suitably has a width (W) and depth (D) of about 1.4 inches, and these dimensions apply to all modules within the assembly illustrated, in part, in FIG. 3, supra.

Each module is also provided with four rows of embedded through-vias 53 bordering each side of the module tub (i.e., the central area of the module housing the processor and buffer chips) four rows deep, and each row comprising 25 vias to provide a total of 400 matching through-vias. As illustrated in FIG. 4, the through-vias 53 have diameters within the module matrix of approximately 0.01 inch and terminate at larger contact pads 52 having diameters, for instance, of about 0.035 inch and are spaced on centers of about 0.035 inch. After assembly and wiring of the module components, the module tub 57 is evacuated in inert atmosphere (e.g. nitrogen) and hermetically sealed lid 44 which is bonded by metallization or adhesive 58.

Figure 5:
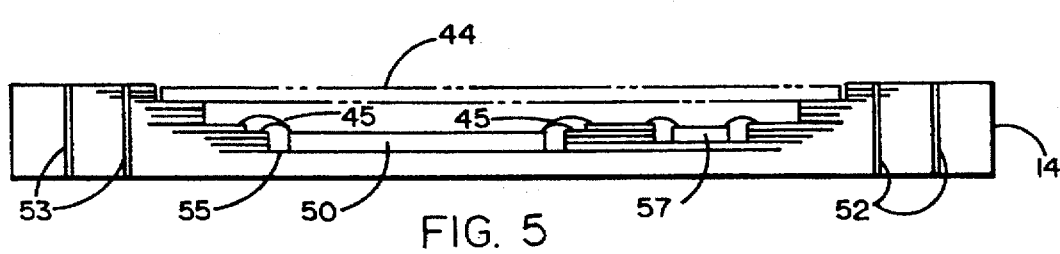
FIG. 5 is a side sectional view of the processor module of FIG. 4.

As illustrated in FIG. 5, processor module 14 comprises 16 total refractory layers, having five layers of lamina below the base 55 of the interior tub and has an over all height of nominally 0.09 inch. These dimensions, and the diameters and spacing of through-vias 53, become significant in view of the necessity of maintaining the integrity of all signal leads from a module, such as processor module 14, which as illustrated in FIGS. 4 and 5, has 396 active wire bonds 45 and bond pads 54. It, therefore, has 396 active internal traces or vias between or within the module lamina (not illustrated in FIG. 4) communicating between the several components of the processor module and through-vias 53.

Figure 6:
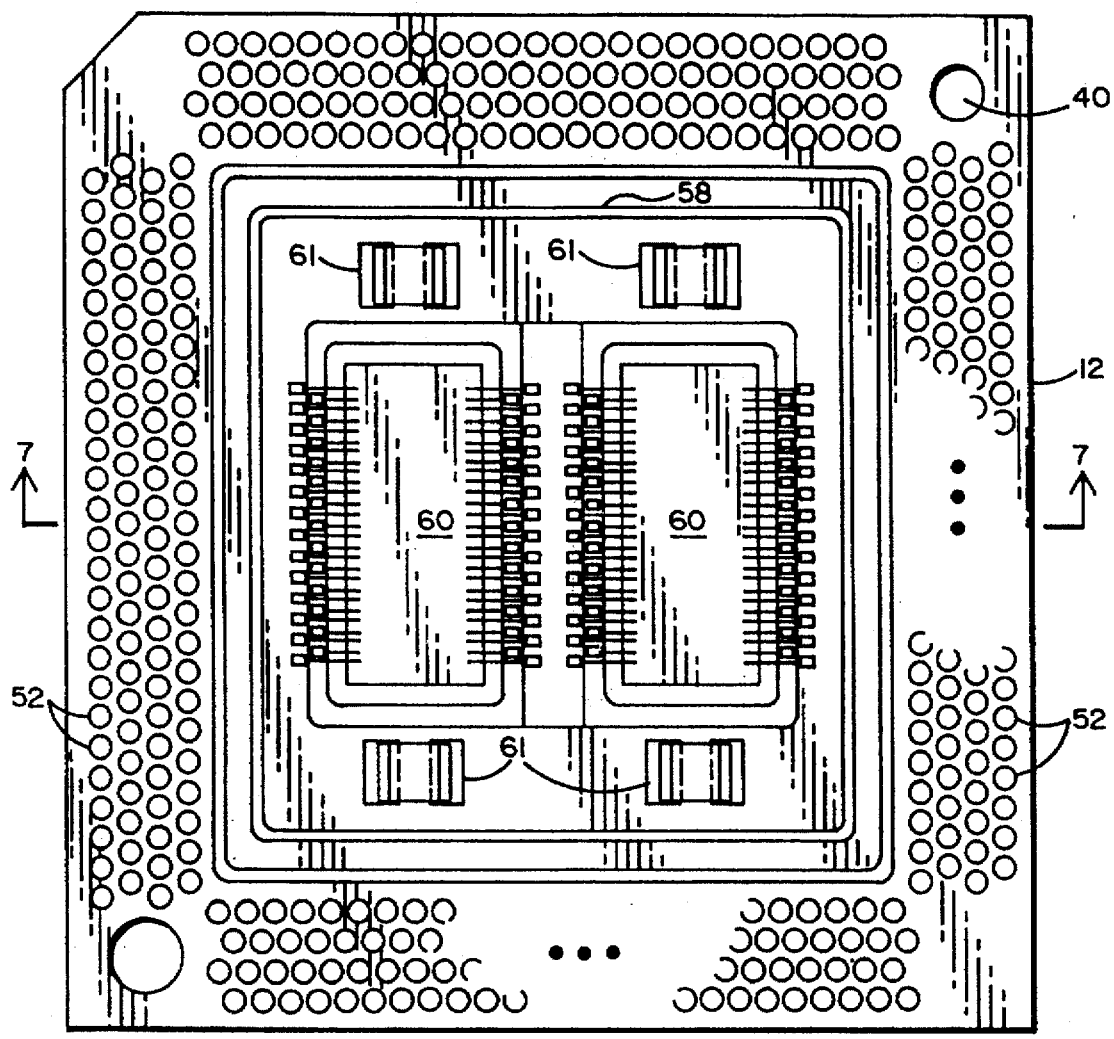
FIG. 6 is a top planar view of one of the two static RAM (SRAM) modules of the assembly of FIG. 3 showing two mounted SRAM chips, capacitors and other module components.
Figure 7:
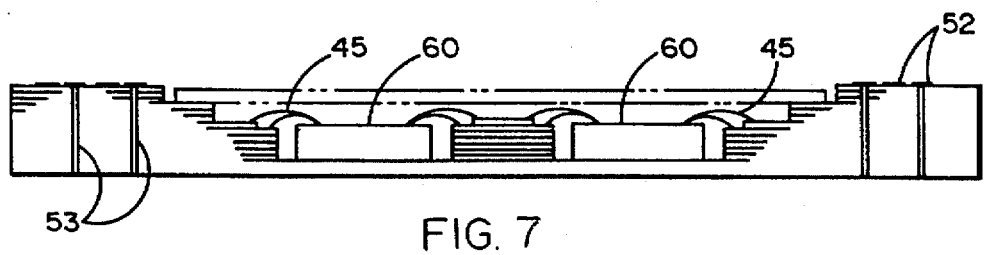
FIG. 7 is a side sectional view of the SRAM module of FIG. 6.

The SRAM modules 12, one of which is illustrated in top planer perspective in FIG. 6, have the same height and width as processor module 14 and the same number and spacing of through-vias 53 and contact pads 52. The interior or tub of the module, the perimeter of which is defined generally by hermetic seal bond ring 58, is also generally the same as that illustrated for the processor module 14. However, the SRAM, module contains two SRAM chip stacks 60 wire-bonded to outer bond pads at two levels as better illustrated in FIG. 7, which is a side-sectional view taken along Section 7—7 of FIG. 6. Module 12 is also provided with four capacitors 61 ancillary to the SRAM units. Due to the height and bond pad configuration on the two SRAM units 60, module 12 has an overall height of about 0.13 inch.

Figure 8:
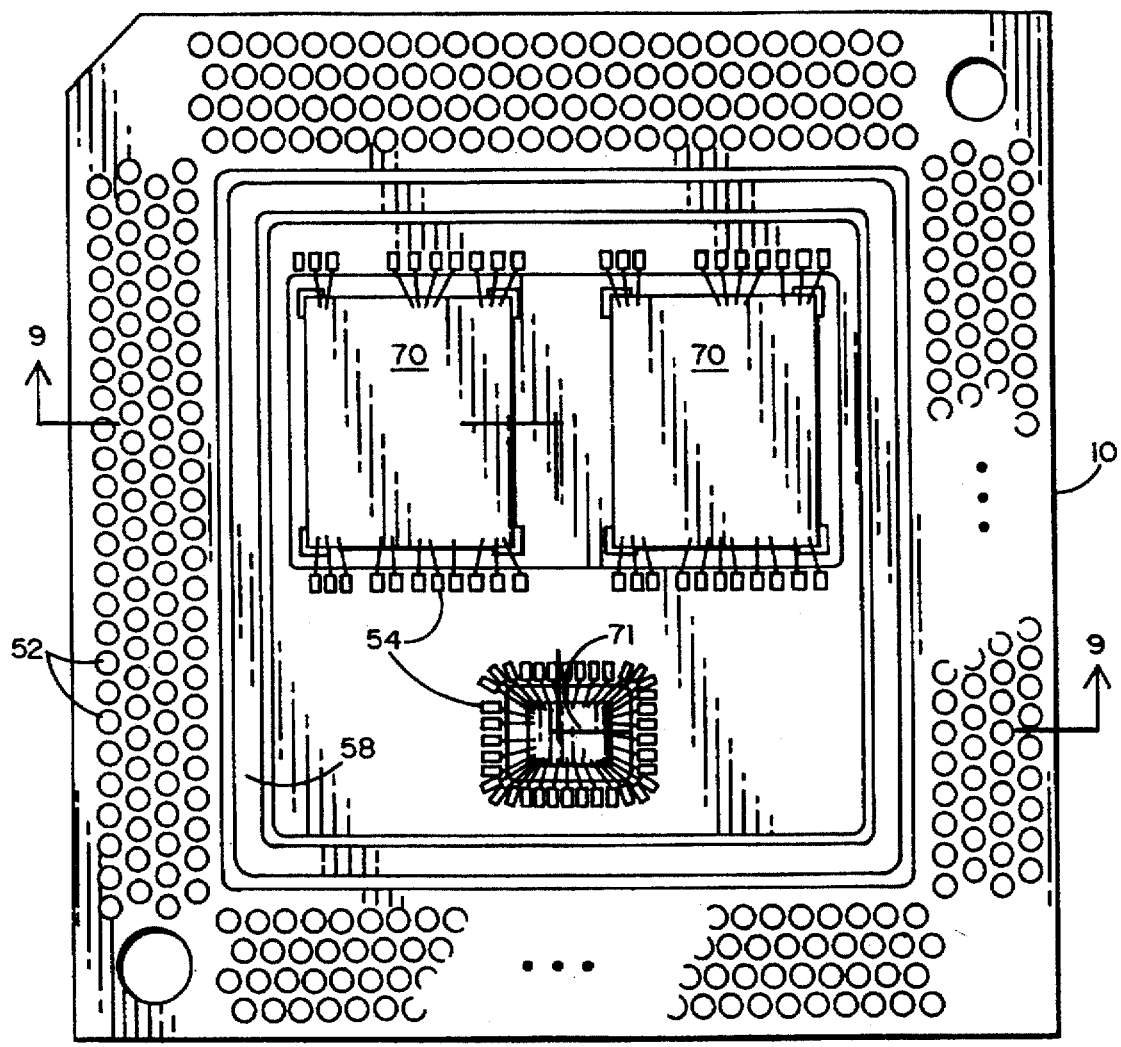
FIG. 8 is a top planar of one of the two program-containing modules of the assembly of FIG. 3 illustrating the mounted electrically erasable programmable ROM chips and one mounted data buffer chip.
Figure 9:
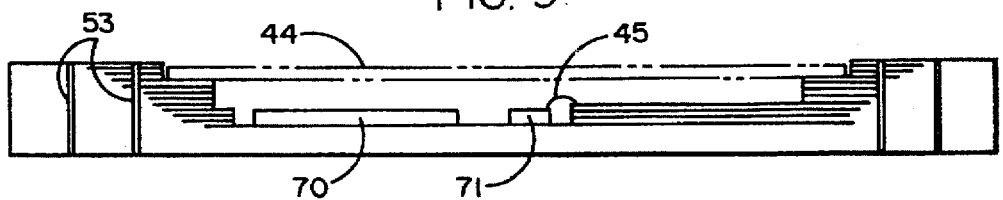
FIG. 9 is a side sectional view of the programmable module of FIG. 8.

The last two modules of the assembly, EEPROM modules 10, are illustrated in FIG. 8 in top planer view and in FIG. 9 and in off-set sectional view taken along section 9—9 of FIG. 8. Each of these modules comprises 2 EEPROM chips 70 which can be AT28 C 010 chips available from ATMEL, and data buffer (temporary data storage) chip 71. Each of modules 10 has the same exterior dimensions as processor module 14 and the same number and spacing of internal vias 53 and via bond pads 52.

The bodies of modules 10, 12, and 14 can be manufactured of any suitable dielectric material capable of providing the necessary placement and integrity of through-vias 53, contact pads 52, and the necessary electrical connections, such as wire bond pads 54 and signal traces or vias communicating between pads 54 and through-vias 52. The signal traces are illustrated in FIGS. 10 and 11 and are discussed hereinafter.

One manner in which the buried signal traces connecting the I/O leads of electronic components contained within the module to the through-vias is illustrated in FIGS. 10 and 11, of which FIG. 10 is a top planer view of a segment of a module similar to those illustrated in FIGS. 3–9 and FIG. 11 is a side-sectional view of the segment illustrated in FIG. 10 taken along section line 11—11 of FIG. 10. The module body 80 contains a hypothetical electronic component 83 having I/O pins 84 mounted to the floor of the internal well in the module by suitable adhesive 89, such as epoxy or solder well known in the art. The module well is bordered by 5 rows of through-vias 81 embedded within the module layers 87 and extending continuously vertically through the module body as illustrated in FIG. 11. The vias terminate in contact pads 82 at either end of each via. I/O pins 84 of device 83 are interconnected by wire bonds 85 with outer bond pads 86 on the buried traces 88. Each of traces 88 is, in turn, connected to one or more of the vertical vias 81 as illustrated, in part, in the side sectional view of FIG. 11. FIG. 11 illustrates, in part, the four lowermost traces illustrated in FIG. 10 showing that they originate at bond pads 86 at four different levels in the module cross-section thereby enabling them to extend, uninterrupted and without interference, into the interior of module body 80 along the dielectric layer planes 87.

Any variations of the signal wiring arrangement illustrated in FIGS. 10 and 11 suitable for communicating signals from device 83 to through-vias 81 can be employed within the concepts of this invention. For instance, device 83, often an IC chip, can be flip-chip bonded to signal leads running from the floor of the module tub to the traces 88 embedded between layers 87 of the module body 80. Also, lateral internal vias can be employed to communicate signals from bond pads 86 to the vertical through-vias 81. Such lateral embedded vias can be formed along the same patterns as those illustrated for the signal traces illustrated in FIGS. 10 and 11 with the exception that such vias would occupy a channel through a portion or all of the height of an appropriate layer 87 of the module body.

The module assemblies comprise at least two modules up to the number of modules required to house the desired circuitry in a unitary structure, with the limiting factor on module number generally being thermal conductivity and heat load. Typically, most assemblies can be effectively integrated within two to about ten modules assembled as illustrated in FIGS. 3 and 4 with most circuits requiring at least about three of such modules.

Module dimensions are also widely variable, and the modules can be of any size required to house the circuits involved, and they are preferably as small as possible to achieve that function. Typically, the depth (D) and width (W) of the modules as illustrated in planer view of FIG. 3 are about 5 inches or less, preferably about 3 inches or less in the maximum of those dimensions. Module height is determined by the number of layers of lamina in the module which, in turn, is largely a function of design convenience (for housing electronic components) and the number and configuration of signal power, ground, and shielding traces or other leads, from contained circuitry to the through-vias. A greater number of signal leads, as well as a greater number of through-vias, can be effectively managed in one unitary structure with more layers in the module to provide a greater number of interlaminer layers through which to run signal leads or lateral signal vias. Thus, these modules will comprise at least two, generally at least three, and typically at three to about thirty layers of lamina determined primarily by the height of contained electronic components and the number of signal leads and through-vias in the module.

The number of signal connections per module will depend, of course, upon the components contained in that module and usually is at least about 10, often at least 20, and generally about 50 to as high at 1000 or more leads per module. Most typical modules will involved about 50 to about 400 signal leads interconnected either internally within the same module or with the through-vias. The number of signal leads and their orientation, in turn, determines the number and layout of signal traces, lateral vias, or other type of interconnections between module components and/or the through-vias.

The number of through-vias must be adequate to accommodate the number of signals transmitted between modules internal of the assembly and exiting the assembly as well as to provide adequate component testing capability and heat transfer. As in the case of the other components of the modules, the number of through-vias can vary considerably in view of demands imposed by the circuits involved. Ordinarily, however, each module in the assembly will have at least about 20, typically at least 50, and most often 50 to as many as 1000 through-vias per module, and each module in an assembly typically will contain the same number and layout of through-vias. However, different numbers of vias can be used in different modules in the same assembly, for instance, to provide interconnections between two or more modules within an assembly having an overall greater number of total modules. Vertical via spacing and size are related to accommodate signal and heat carrying capacity and to reduce overall module dimensions as much as possible. In this regard, through-via spacings as low as 0.02 inch on centers can be readily achieved with vias having diameters as small as 0.008 inch and contact pads at either end of the vias of 0.012 inch. Through-vias of this type provide a number of advantages including heat transfer as discussed above, and for this reason, a number of through-vias in excess of that required simply for signal carrying capability can be provided to facilitate heat transfer and to provide flexibility for reworking module assemblies, for rerouting leads as required to accommodate modified modules, and for test pads for in-lab or in-field testing.

The modules or "tubs" can be fabricated from any suitable dielectric, preferably high temperature resistant dielectrics including plastics and ceramics, by procedures well known in the art, such as those discussed for cofired laminated ceramics and laminated plastics in "Electronic Packaging and Interconnection Handbook", McGraw-Hill, 1991, Sections 6.2.3 and 6.2.4, pages 6.30 et seq. and by Palmer and Newton in "3-D Packaging Using Low-Temperature Cofired Ceramics (LTCC)", International Journal of Microcircuits and Electronic Packaging, vol. 16, no. 4, fourth quarter 1993 pages 279–284, the disclosures of which are incorporated herein by reference in their entireties. High temperature cofired ceramic and pressed ceramic technologies, as well as other technologies used for producing multilaminar modules of the type illustrated in the drawings and discussed herein, can also be employed. Suitable ceramics or, more broadly, refractory inorganic oxides, include the many temperature resistant, dielectric inorganics known in the art such as alumina, beryllia, aluminum nitride, silicon carbide, silica, etc. Illustrative plastics include high temperature epoxies, polyimides, triazines, temperature resistant phenolic resins, etc.

Typical ceramic composites having signal traces and through-vias as illustrated herein can be prepared by forming a dispersion or slurry of ceramic powder, casting the slurry into thin sheets, and drying to form sheets of "green" tape ready for size cutting, hole punching (e.g., for the vertical vias described herein), and cutting out areas to be the center cavities of the modules. At this stage, signal traces can also be screened onto the surface for connections between wire bond pads and the through-vias, intramodule connections, or otherwise, using, for instance, a tungsten powder slurry; and the via holes can be filled with metal. The tungsten slurry used for signal trace screening can also be employed for this purpose or molybdenum-manganese alloys can be substituted for tungsten in the vias and/or traces. Multiple sheets cut to form one module tub are then press-laminated together in a confining fixture and fired, e.g., at 1,600 C°, in a non-oxidizing atmosphere to form the module body containing embedded signal traces and through-vias.

Lead attachment and metallization plating can then be accomplished by procedures well known in the art such as plating the exposed tungsten traces with nickel in preparation for led brazing or with Kovar, specialized iron-nickel-cobalt alloys, or Alloy-42 for gold-copper eutectic alloy braising. These procedures are conventional in the art and do not constitute an aspect of this invention. Accordingly, any methods and materials suitable for forming conductive signal traces, through-vias, wire bonding pads, etc. can be employed. The signal trace and bond pad layouts for component-to-component and component-via interconnects can be designed manually, although the procedure can become time consuming with complex three dimensional, multimodular assemblies. More expeditious design and signal trace layout can be accomplished with available MCM CAD tools such as Cadence Allegro, available from Cadence Design Systems, Inc., San Jose, Calif., and MCM Station available from Mentor Graphics, Inc., Wilsonville Oreg.

Similar procedures can be employed to manufacture module bodies using laminated plastic technologies by preparing and cutting thin sheets of suitable plastic, such as those noted above, to form interior cavities and through-vias. Signal traces and wire bond pads can be formed by copper, nickel, and/or gold plating. Also at this stage the holes for vertical vias can be filled with conductive metals such as gold, silver, copper, or aluminum by pressing the metal in paste form through a screen mask using a squeegee. There are a number of reputable suppliers for multi-laminar modules using technologies compatible with the module designs of this invention having the through vertical vias described. Illustrative are Kyocera, San Diego, Calif.; Micro Electronic Packaging, Inc., San Diego, Calif.; and Coors Electronic Packaging, Inc., Chattanooga, Tenn.

After the modules are formed, the electronic components are mounted and wire bonded as described, in part, above, typically with gold or aluminum wire, the module contents are encapsulated in a polymeric coating and sealed hermetically with a metal or ceramic lid, and the module is sealed as described above. After environmental and functional testing, the modules then can be assembled as illustrated, in part, in FIG. 3 and described above, using a resealable, multichannel connector array, several types of which are presently available from manufacturers in the component packaging industry. The connector array matrix is usually a non-adherent, resealable plastic, such as the high temperature epoxies, polyimides, triazines, and phenolics referred to above. These connector arrays can be custom designed to provide one or more connector contacts for each through-via in the modules so that adequate interconnection of vias in adjacent modules is ensured, provided there is accurate placement of modules and connector arrays. The connector arrays are preferably compressible and also preferably have compressible electrical contact (connector) areas to better ensure adequate via-to-via contact for all through-vias. Suitable arrays usually have contact spacings of about 0.01 to about 0.1 inch on centers, corresponding to the usual center-to-center placement of through-vias.

Figure 12:
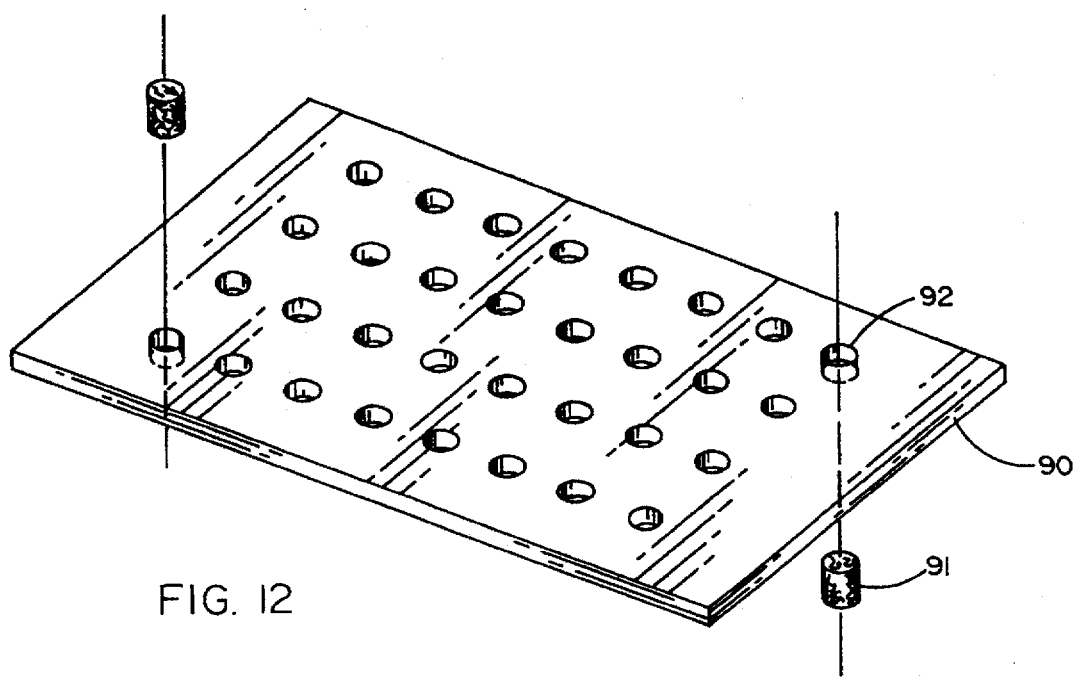
FIG. 12 is a transparent isometric view of a button-type intermodular connector useful in accordance with this invention.
Figure 13A:
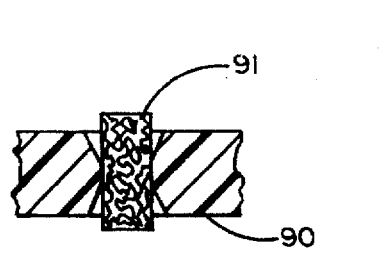
FIGS. 13(a), (b) and (c) are schematic illustrations of connector variations useful in the intermodular connectors of FIG. 12.
Figure 13B:
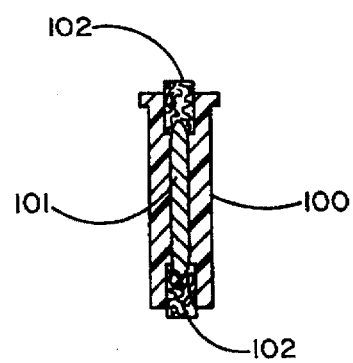
Figure 13C:
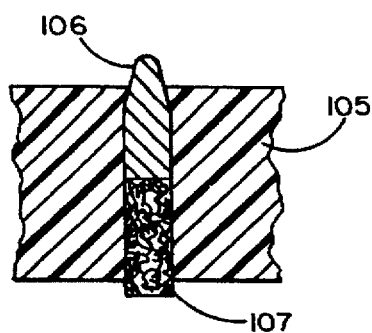
Figure 14A:
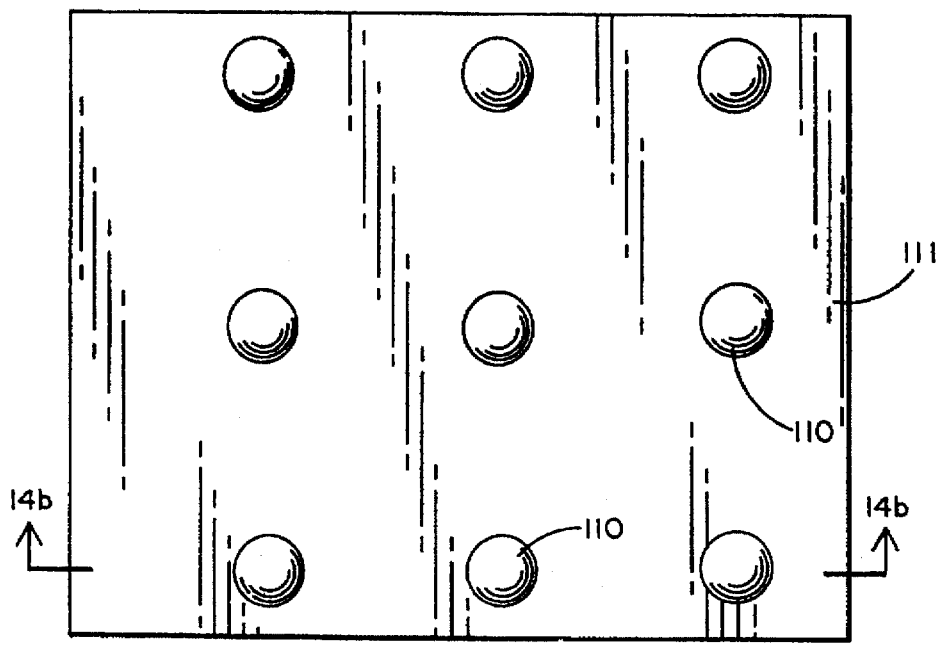
FIGS. 14(a) and (b) are top and sectional views, respectively, of a conductive epoxy button connector useful as an intermodular connector in accordance with this invention.
Figure 14B:
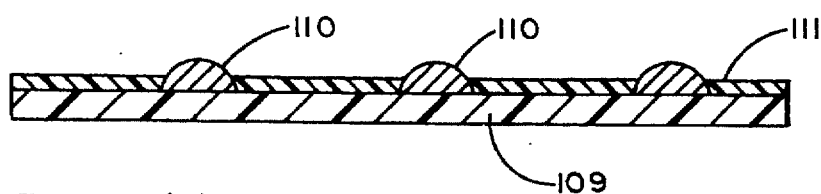
Figure 15A:
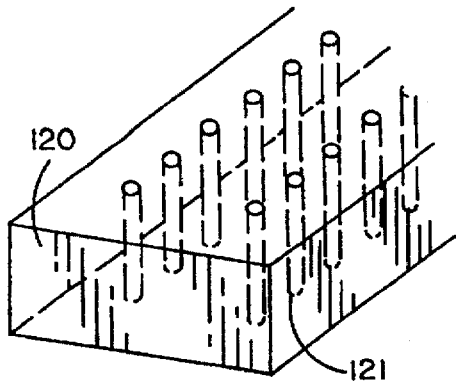
FIGS. 15(a) and (b) are transparent partial isometric views of two types of compressible multi-wire intermodular connectors useful in this invention.
Figure 15B:
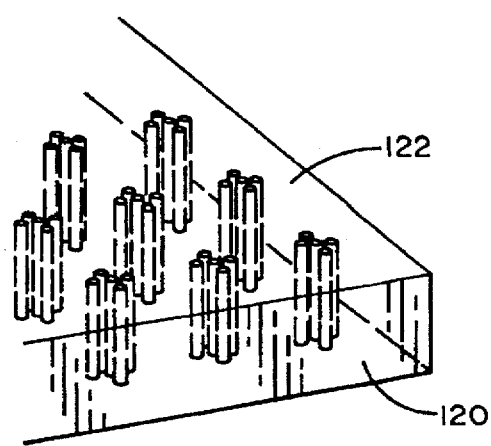

Suitable connector arrays are, for instance, the "CIN::APSE" and "Fuzz Button" connectors available from Cinch Connectors, Elk Grove Village, Ill., examples of which are illustrated in FIGS. 12 and 13; the embedded, silver-filled epoxy dots illustrated in FIG. 14 and available from Merix Corporation, Needham Heights, Mass; the embedded wire-filled silicone rubber dots illustrated in FIG. 15 available from Fujipoly Inc., Cranford, N.J.; and the "Matrix MOE" elastomeric connectors available from Elastomeric Technologies, Inc., Hatboro, Penn., FIG. 12 illustrates a section of a "Fuzz Button" connector array showing a transparent isometric of a dielectric layer 90 having a grid of apertures 92 into which are fitted compressible, conductive "Fuzz Buttons" 91, each of which preferably protrudes beyond the surface of substrate 90 a minor amount, e.g., about 0.003 to about 0.01 inch per side sufficient to ensure contact with the through-via contact pads. Substrate 90 can comprise any suitable insulating material, generally a plastic such as the epoxies and temperature resistant polyimides and triazines referred to above. The insulating layer 90 is preferably as thin as possible to ensure adequate sealing of the modules and adequate strength of the multi-channel contact array and can be obtained in substrate thicknesses as low as 0.032 inch. The buttons are randomly wound cylinders of gold-plated, resilient, conductive wire retained in hourglass-shaped apertures 92.

FIGS. 13(A), (B), and (C) illustrate variations of the button contacts illustrated in FIG. 12 which are also available from Cinch Connectors, Inc., with FIG. 13(A) showing an expanded view of the button contact 91 of FIG. 12 in dielectric substrate 90. FIG. 13(B) illustrates a similar contact comprising non-conductive cylinder 100 containing conductive pin 101 on either end of which are mounted compressible randomly wound conductive wire contacts 102, such as the button contacts 91 of FIGS. 12 and 13(A). FIG. 13(C) illustrates yet another variation of these contacts showing a dielectric substrate 105 containing conductive metal pin 106 opposed by compressible, randomly wound conductive wire button or cylinder 107.

FIGS. 14(A) and (B) illustrate, respectively, a top planar view and a side sectional view of conductive, silver-filled epoxy dots 110 about 0.02 inch in diameter on 100 mil spacing embedded in dielectric epoxy substrate 111. This type of connector array can be obtained with dielectric thicknesses as small as 0.002 inch or less and dot heights of 0.004 inch available from Merix Corporation, supra. These arrays of epoxy dots can be deposited directly on one or both surfaces of the modules with the location of the dots corresponding to the location of through via contact points at the module surface.

FIGS. 15(A) and (B) are transparent isometric illustrations of Fujipoly Inc.'s W Series "L" and "S" pattern conductors, respectively, which are yet another alternative for use as the multichannel contact arrays. Both conductor arrays comprise a dielectric silicon rubber sheet 120 containing either single bundles of embedded, gold plated wires ("L" pattern) 121 in FIG. 15(A) or multiple bundles of gold plated metal wires 122 for the "S" pattern illustrated in FIG. 115(B). In both instances, the conductive portion 121 and 122 of the substrate 120 contains about 300 to about 2,000 free metal wires per square centimeter of conductive area. These arrays and others available from Fujipoly can be obtained with wire bundle spacing customized to correspond to the spacing of through-via contact pads on modules formed in accordance with this invention to provide useful, resealable multichannel contact arrays.

Numerous variations and modifications of the foregoing concepts of this invention will be apparent to one of ordinary skill in the art in view of the foregoing disclosure and drawings, and it is intended that such variations be encompassed within the appended claims.

We claim:

1. A stacked, resealable, multimodular, electronic circuit assembly comprising:
   (1) at least two stacked modules, each module comprising a dielectric substrate having upper and lower planar surfaces and at least one cavity in at least one of said surfaces said cavity having lesser width and breadth than said one surface, thereby forming a dielectric substrate matrix surround said cavity;
   (2) at least one electronic component comprising a three-dimensional stack of IC chips positioned within at least one cavity of each of the said modules and having I/O contacts;
   (3) a closure plate overlying said cavity, enclosing same and bonded to said one surface to provide a hermetic seal of said cavity;
   (4) a plurality of electrically conductive through-vias between said upper and lower planar surfaces of each of said modules outside of said cavity and within said matrix, each of said through-vias having exposed electric contact points where it penetrates said upper and lower planar surfaces;
   (5) said I/O contacts of said electronic components in each of said modules being electrically connected with through-vias in each respective module; and
   (6) a planar, multichannel connector between each opposing pair of said modules for sealing said modules when pressed together and having separate electrically conductive through channels in an array on centers of 0.2 inch or less and electrically coupling opposing through-vias in said adjacent modules.

2. The assembly defined in claim 1, wherein said modules comprise multiple, laminated, dielectric lamina oriented in planes generally perpendicular to the major axis of said through-vias.

3. The assembly defined in claim 2, wherein said layers of dielectric lamina comprise a refractory inorganic oxide, nitride, carbide, or combination thereof.

4. The assembly defined in claim 2, wherein said I/O contacts are connected to said through-vias by electrically conductive paths along the interfaces between adjacent layers.

5. The assembly defined in claim 4, comprising at least two rows of said through-vias bordering at least one side of said cavities in said modules, and the number of interfaces between said layers in at least one of said modules is at least equal to the number of said rows of said through-vias.

6. The multimodular assembly defined in claim 5, wherein said electronic components within said assembly, combined, have at least about 50 of said I/O contacts electrically connected to said through-vias, and each of said modules has at least about 50 of said through-vias electrically connected with corresponding opposing vias on adjacent modules.

7. The assembly defined in claim 4, comprising at least four rows of said through-vias bordering to at least one side of the cavities in said modules and at least about five layers of lamina in at least one of said modules forming interfaces available for forming conductive paths between said I/O contacts and said through-vias.

8. The multimodular assembly defined in claim 4, comprising at least three of said stacked modules, at least about 50 of said through-vias, and at least about 50 I/O contacts on said components connected to said vias.

9. The multimodular assembly defined in claim 2, wherein said I/O contacts are interconnected with said through-vias in a pattern such that each of said components can be tested by determining electrical signals in said through-vias.

10. The stacked, multimodular assembly defined in claim 2, further comprising a number of said through-vias in excess of that required for connection with said I/O contacts on said components such that said assembly comprises unconnected through-vias.

11. The multimodular assembly defined in claim 10, comprising at least one memory IC chip.

12. An expandable memory, stacked, multimodular assembly comprising the assembly defined in claim 10 having memory and processor logic circuitry.

13. The assembly defined in claim 1, wherein said multichannel connector array comprises a dielectric plastic or elastomeric layer comprising said electrically conductive channels.

14. The assembly defined in claim 13, wherein each of said channels comprises an aperture through said layer containing a compressible electrically conductive wire bundle.

15. The assembly defined in claim 5, wherein said compressible wire bundle comprises a randomly wound wire strand.

16. A stacked, resealable, multimodular, electronic circuit assembly comprising:
   (1) at least two stacked modules, each module comprising a dielectric substrate formed of multiple, dielectric lamina having upper and lower planar surfaces forming interfaces between adjacent lamina, and at least one cavity in at least one of said surfaces, said cavity having lesser width and breadth than said one surface, thereby forming a dielectric substrate matrix surrounding said cavity;
   (2) a plurality of electrically conductive through-vias oriented along axes generally perpendicular to the planar surfaces of said lamina and arrayed in at least two rows of said through-vias bordering at least one side of said cavities in said modules, and the number of interfaces between said layers in at least one of said modules is at least equal to the number of said rows of said through-vias between said upper and lower planar surfaces of each of said modules outside of said cavity and within said matrix, each of said through-vias having exposed electric contact points where it penetrates said upper and lower planar surfaces;
   (3) at least one electronic component comprising a three-dimensional stack of IC chips positioned within at least one cavity of each of the said modules and having I/O contacts connected to said through-vias by electrically conductive paths along the interfaces between adjacent layers;
   (4) a closure plate overlying said cavity, enclosing same and bonded to said one surface to provide a hermetic seal of said cavity;

(5) at least about 50 of said I/O contacts electrically connected to said through-vias, and each of said modules has at least about 50 of said through-vias electrically connected with corresponding opposing vias on adjacent modules with said I/O contacts of said electronic components in each of said modules being electrically connected with through-vias in each respective module;

(6) a planar, multichannel connector array between each opposing pair of said modules having separate electrically conductive channels electrically coupling opposing through-vias in said adjacent modules and for sealing said modules when pressed together; and (7) contact pads at either end of said through-vias having a diameter greater than the maximum diameter of the through-vias, with said through-vias arranged in a grid pattern on centers of about 0.2 inch or less, and each having a diameter within the module matrix of about 0.05 inch or less.

17. A stackable module for containing and interconnecting electronic components comprising a dielectric substrate having upper and lower planar surfaces and at least one cavity on at least one of said surfaces for containing one or more three-dimensional IC chip stacks, said substrate comprising multiple, laminated layers of said dielectric, at least 100 electrically conductive through-vias between said upper and lower planar surfaces of said module outside of said cavity and within the matrix of said module in a grid pattern bordering said cavity and being spaced on centers of about 0.2 inch or less and having maximum diameters within the matrix of said module of about 0.05 inch or less, each of said through-vias having exposed electric contacts at either end where it penetrates said upper and lower surfaces of said planar substrate and electrically conductive signal paths interconnecting said through-vias and the interior of said cavity and being located between said layers of said module for communicating electronic signals to and from electronic components within said cavity, and a closure plate covering said cavity and sealed thereabout to hermetically contain said cavity.

18. The stackable module defined in claim 17, comprising at least three of said laminated layers and having said electrically conductive pathways between at least two of said layers interconnecting said through-vias and said cavity.

19. A multimodular assembly comprising at least two stacked modules defined in claim 17, each containing at least one electronic component and at least one of said modules containing said three-dimensional stack of IC chips, the I/O contacts of said electronic components being interconnected with said through-vias via said inter laminar electronic signal paths, each of said modules being electrically interconnected with at least one adjacent module through a resealable, multichannel connector array having separate electrically conductive channels electrically coupling each pair of opposing, matching through-vias in said adjacent modules and for sealing said modules.

20. A stacked, resealable, multimodular, electronic circuit assembly comprising at least three stacked modules, each module comprising multiple laminated dielectric lamina layers of a refractory inorganic oxide forming a dielectric substrate having upper and lower planar surfaces and at least one cavity in at least one surface of each of said modules for containing at least one electronic component;

a. said laminated dielectric lamina being oriented in planes generally parallel to said upper and lower planar surfaces;

b. at least one three-dimensional chip stack of electronic components positioned within at least one cavity on each of said modules and having I/O contacts;

c. at least about 200 electrically conductive through-vias between said upper and lower planar surfaces of each of said modules through the matrix thereof outside of said cavity and within the outer surface of each module, each of said through-vias having exposed electrical contact points where it penetrates said upper and lower planar surfaces of said module, and the position of said contact points on each surface of said module corresponding to the position of corresponding through-via contact points on adjacent modules, whereby said contact points can be electrically interconnected as described hereinafter;

d. at least about 100 of said I/O contacts of said electronic components being electrically connected to said through-vias by electrically conductive paths along the interfaces between adjacent layers of said dielectric lamina; and e. a resealable, multichannel connector array between each opposing pair of said modules having separate electrically conductive channels electrically coupling opposing, matching through-vias in said adjacent modules and for sealing said modules when pressed together, thereby hermetically sealing each of said cavities, said multichannel connector array comprising a dielectric plastic or elastomeric layer with said electrically conductive channels in an array on centers of about 0.2 inch or less.

21. The multimodular assembly defined in claim 20, wherein each of said channels in said connector array comprises an aperture through said layer containing a compressible, electrically conductive wire bundle.

22. The stacked, multimodular assembly defined in claim 20, wherein said through-vias constitute continuous thermal conductive paths through said assembly.

23. A method for assembling and electrically interconnecting electronic components which comprises positioning at least one three-dimensional IC chip array in said cavities of each of at least 2 of said modules defined in claim 17, closing and hermetically sealing each of said cavities with a closure plate to form hermetically sealed modules, and electrically connecting the I/O contacts of each said IC chip array to said conductive through-vias, stacking said modules and electrically interconnecting said through-vias therein by interposing between each adjacent pair of modules a multichannel connector array comprising a compressible, dielectric layer having electrically conductive channels corresponding to and interconnecting each opposing pair of through-vias in adjacent modules when pressed together; said through-vias and electrically conductive channels in said connector array being spaced on centers of about 0.2 inch or less.

24. The method of claim 23 which comprises using a dielectric plastic or elastomeric layer as said multichannel connector array.

* * * * *